(12) United States Patent
Nwokoye et al.

(10) Patent No.: US 11,971,464 B1
(45) Date of Patent: Apr. 30, 2024

(54) MAGNON EXCITATION AND DETECTION SYSTEMS, APPARATUS, AND METHODS

(71) Applicant: The Government of the United States of America, as represented by the Secretary of the Navy, Arlington, VA (US)

(72) Inventors: Chidubem A. Nwokoye, Germantown, MD (US); JinHyeong Yoo, Germantown, MD (US); Nicholas J. Jones, Fairfax, VA (US)

(73) Assignee: The United States of America, represented by the Secretary of the Navy, Washington, DC (US)

( * ) Notice: Subject to any disclaimer, the term of this patent is extended or adjusted under 35 U.S.C. 154(b) by 508 days.

(21) Appl. No.: 17/129,624

(22) Filed: Dec. 21, 2020

Related U.S. Application Data

(60) Provisional application No. 62/950,987, filed on Dec. 20, 2019.

(51) Int. Cl.
*G01R 33/32* (2006.01)
*G01R 33/34* (2006.01)
(Continued)

(52) U.S. Cl.
CPC ..... *G01R 33/323* (2013.01); *G01R 33/34053* (2013.01); *H04B 10/90* (2013.01); *H04B 13/00* (2013.01)

(58) Field of Classification Search
CPC ............ G01R 33/323; G01R 33/34053; G01R 33/02; G01R 33/096; G01R 33/0023; G01R 33/30; G01R 33/09; G01R 33/1284; G01R 33/3873; G01R 15/205; G01R 33/20; G01R 33/385; G01R 33/341; G01R 33/36; G01R 33/3621; G01R 33/5659; G01R 33/3692; G01R 33/422; G01R 33/0385; G01R 33/3628; G01R 33/62; G01R 33/3852; G01R 33/4836; G01R 33/5611; G01R 33/4616; G01R 33/446; G01R 33/3614; G01R 33/3607; G01R 33/54; G01R 33/3657; H04B 10/90; H04B 13/00; H04B 5/0018; H04B 5/02; H04B 13/02; H04B 5/00; H04B 5/0012; H04B 1/18; H04B 15/04; H04B 1/30; H04B 11/00;
(Continued)

(56) References Cited

U.S. PATENT DOCUMENTS 5,307,516 A * 4/1994 Nomoto ................... H04B 1/18
455/214
5,457,388 A * 10/1995 Peeren ............... G01R 33/3873
324/319
(Continued)

FOREIGN PATENT DOCUMENTS

| CN | 104678332 B | 3/2018 |
|---|---|---|
| CN | 109799468 B | 7/2021 |
| CN | 113519098 A | 10/2021 |

*Primary Examiner* — Lana N Le
(74) *Attorney, Agent, or Firm* — Dawn C. Russell; Jesus J. Hernandez

(57) ABSTRACT

Magnon excitation and detection systems, apparatus, and methods are provided. The systems and apparatus may include magnon exciters and magnon detectors. The systems and apparatus are used in accordance with methods for exciting and detecting magnons.

8 Claims, 9 Drawing Sheets

(51) Int. Cl.
*H04B 10/90* (2013.01)
*H04B 13/00* (2006.01)

(58) Field of Classification Search
CPC ......... H04M 1/72412; H04M 2250/02; H04M 2250/12; H04W 76/10; H04W 84/18; H04W 88/06; H03K 19/19; H03B 15/006; H03B 17/00; H01F 7/0278
See application file for complete search history.

(56) References Cited

U.S. PATENT DOCUMENTS

| | | | |
|---|---|---|---|
| 6,336,031 B1 * | 1/2002 | Schyndel | H04B 13/00 |
| 7,430,074 B2 | 9/2008 | Korenblit | |
| 7,471,449 B2 | 12/2008 | Korenblit | |
| 9,543,894 B2 | 1/2017 | Akerman | |
| 9,601,267 B2 * | 3/2017 | Widmer | H04B 5/00 |
| 10,186,746 B2 | 1/2019 | Haldar | |
| 10,775,454 B2 * | 9/2020 | Poole | G01R 33/385 |
| 10,809,322 B1 | 10/2020 | Wang | |
| 11,037,068 B2 | 6/2021 | Girvin | |
| 11,162,894 B2 | 11/2021 | Tankhilevich | |
| 11,515,687 B2 | 11/2022 | Tankhilevich | |
| 11,561,271 B2 * | 1/2023 | O'Brien | G01R 33/34053 |
| 11,635,456 B2 | 4/2023 | Ofek | |
| 2006/0166636 A1 * | 7/2006 | Sato | H04B 1/18 |
| 2014/0333295 A1 * | 11/2014 | Fernandez | G01R 33/023 |
| 2016/0164569 A1 * | 6/2016 | Morton | H04B 1/30 375/296 |
| 2018/0262053 A1 * | 9/2018 | Corum | H04B 13/00 455/41.1 |
| 2019/0331674 A1 * | 10/2019 | Connolly | G01R 33/323 |
| 2020/0388976 A1 | 12/2020 | Kirchner | |
| 2021/0375518 A1 * | 12/2021 | Zheng | H03B 15/006 |
| 2022/0011383 A1 | 1/2022 | Barry | |
| 2022/0042907 A1 | 2/2022 | Tankhilevich | |
| 2022/0299583 A1 | 9/2022 | Gregg | |

\* cited by examiner

MAGNON EXCITATION AND DETECTION SYSTEMS, APPARATUS, AND METHODS

CROSS-REFERENCE TO RELATED APPLICATIONS

This application claims priority under 35 U.S.C. § 119(e) to U.S. Provisional Application No. 62/950,987, filed on Dec. 20, 2019. The entire contents of this application are incorporated herein by reference.

FIELD OF THE INVENTION

The invention is directed to magnon excitation and detection systems, apparatus, and methods. The systems and apparatus may include magnon exciters and magnon detectors. The systems and apparatus are used in accordance with methods for exciting and detecting magnons.

BACKGROUND OF THE INVENTION

In a ferromagnetic material, resonance phenomena occurs when the precession frequency of the magnetic moments equals the frequency of an external oscillating magnetic field that is applied transversely to the magnetic material. This resonance is called the ferromagnetic resonance (FMR), and at this frequency, the material absorbs energy from the oscillating magnetic field. A.V. Chumak, et al., "Magnon transistor for all-magnon data processing." Nature Commun. 5, 4700 (2014).

For several years, FMR absorption was measured by a microwave cavity (M. Prutton, Thin Ferromagnetic Films, Butterworth, Washington (1964)) and the broadband stripline allows for the characterization of materials in a broad range of frequencies (C.T. Boone, et al., "Spin transport parameters in metallic multilayers determined by ferromagnetic resonance measurements of spin-pumping." J. Applied Physics, 113, 153906 (2013); J. M. Shaw, et al., Physical Review B, 87, 168 (2013)). Emerging areas of sensors, magnetically tunable microwave materials and metamaterials (C.S. Chang, et al., Appl. Phys. Lett. 102 (2013) 142405; S.A. Gregory, et al., New J. Phys. 16, 063002 (2014); S. Ghionea, et al., IEEE Sens. J. 8, 896 (2008)) are increasingly characterized by broadband FMR spectroscopy, indicating the importance of FMR spectroscopy measurement techniques.

Magnons are energy quanta of collective wave excitations in a magnetically-ordered ensemble of magnetic moments. Magnons are considered to be bosons, and the amount of magnons in a state is modeled using the Bose-Einstein distribution. F. Bloch, Zur theorie des ferromagnetismus. Zeitschrift für Phys., 61, 3, 206-219 (1930). Their dynamics are described by the Landau-Lifshitz-Gilbert equation, which is expressed as Precession Damping $$\frac{\partial \vec{M}}{\partial t} = -\gamma\left(\vec{M} \times \vec{H}_{eff}\right) - \frac{\gamma\alpha}{M_s}\vec{M} \times \left(\vec{M} \times \vec{H}_{eff}\right) \quad (1)$$

$$\vec{H}_{eff} = \vec{H}_{exch} + \vec{H}_{ani} + \vec{H}_{demag} + \vec{H}_{app}, \quad (2)$$

where, $\vec{M}$ =magnetization vector, $\gamma$=gyromagnetic ratio, $\vec{H}_{eff}$=effective magnetic field vector, $\vec{H}_{exch}$=exchange field, $\vec{H}_{ani}$=anisotropic field, $\vec{H}_{demag}$=demagnetizing field, $\vec{H}^{app}$=applied field, $M_S$=saturation magnetization, and $\alpha$=Gilbert damping parameter.

Assuming the magnetic sample is on the yz-plane and magnons can propagate along the z-axis, the derived general solution is expressed as:

$$\vec{M}(r, t) = jM_y(r, t)\hat{y} + M_z(r, t)\hat{z} \quad (3)$$

$$M_y(r, t) = M_{y0}e^{-j(k_z z - \omega t)} \quad (4)$$

$$M_z(r, t) = M_{z0}e^{-j(k_z z - \omega t)} \quad (5)$$

where $M_{y0}$, $M_{z0}$=complex variable magnetization amplitudes in the y and z-directions respectively, $k_z$=magnon wavenumber, $$r = \sqrt{x^2 + y^2 + z^2},$$

and $\omega$=frequency of precession. B.A. Kalinikos, "Excitation of propagating spin waves in ferromagnetic films." IEE Proc., 127, H1, 4-10 (1980); Z. Frait and D. Fraitova, "Spin-Wave Resonance in Metals." In A.S. Borovik-Romanov & S. K. Sinha (Eds.), Modern Problems in Condensed Matter Science (pp. 1-65) (1988).

Spin waves can be excited in ferromagnetic films using microwave waveguides such as coplanar waveguides, striplines, slotlines, etc. Theoretical studies in literature for the propagation of spin waves in ferromagnets indicate that the dispersion of the spin waves are of two categories, namely: (i) dispersion without the influence of exchange interaction (magnetostatic), (ii) dispersion with both exchange and dipole interactions. See Kalinikos, "Excitation of propagating spin waves in ferromagnetic films." IEE Proc., 127, H1, 4-10 (1980); M. Wu, "Nonlinear Spin Waves in Magnetic Film Feedback Rings." Solid State Physics, 62, 163-224 (2010).

Magnetostatic spin waves are categorized into three types, namely: forward volume magnetostatic spin waves (FVMSW), backward volume magnetostatic spin waves (BVMSW), and magnetostatic surface spin waves (MSSW). Equations (6)-(8) list their derived dispersion equations as:

$$f_{MSSW} = \sqrt{\left(f_H + \frac{f_M}{2}\right)^2 - \left(\frac{f_M}{2}\right)^2 e^{-2E}}, \quad (6)$$

$$f_{BVMSW} = \sqrt{f_H\left(f_H + f_M\left(\frac{1 - e^{-E}}{E}\right)\right)}, \quad (7)$$

$$f_{FVMSW} = \sqrt{f_H\left(f_H + f_M\left(1 - \frac{1 - e^{-E}}{E}\right)\right)}, \quad (8)$$

where E=kl (electrical length), $f_H=\gamma H_{eff}$, $H_{eff}$=effective magnetic field, $f_M=4\pi\gamma M_s$, $\gamma$=gyromagnetic ratio and Ms=saturation magnetization. When k=0 (Kittel mode), Equations (6)-(8) reduce to $$f_{MSSW} = \sqrt{H_{eff}\left(\gamma^2 + \gamma^2 4\pi M_s\right)},$$

$$f_{BVMSW} = \sqrt{H_{eff}(\gamma^2 + \gamma^2 4\pi M_s)},$$

and $f_{FVMSW}=\gamma H_{eff}$.

However, these theoretical studies of spin waves do not address the need for apparatus, systems, and methods for exciting and detecting magnons.

SUMMARY OF THE INVENTION

The invention described herein, including the various aspects and/or embodiments thereof, meets the unmet needs of the art, as well as others, by providing magnon excitation and detection systems, apparatus, and methods. The systems and apparatus may include magnon exciters and magnon detectors. The systems and apparatus are used in accordance with methods for exciting and detecting magnons.

According to a first aspect of the invention, apparatus are provided. The apparatus includes a magnon exciter including an exciter radiofrequency resonator; a radiofrequency signal waveform generator; a radiofrequency signal amplifier; an exciter solenoid; and an exciter power supply. The apparatus further includes a magnon detector including a detector radiofrequency resonator; a low-noise amplifier (LNA); a downconverter; a receiver; a detector solenoid; and a detector power supply. The apparatus excites and detects magnetostatic spin waves in ferromagnetic materials.

According to an additional aspect of the invention, systems are provided for communicating data via magnetostatic spin waves. The systems include a magnon exciter generating magnetostatic spin waves in a ferromagnetic material, the magnetostatic spin waves generated by pulsed modulated oscillating magnetic fields; and a magnon detector receiving the magnetostatic spin waves propagating through the ferromagnetic material, and converting the pulsed modulated oscillating magnetic fields coupled to the magnetostatic spin waves into a radiofrequency signal.

According to another aspect of the invention, methods for exciting magnetostatic spin waves in a ferromagnetic material having ferromagnetic resonance (FMR) frequencies are provided. The methods include providing a solenoid generating a bias magnetic field at an excitation surface of the ferromagnetic material, where the bias magnetic field is parallel to a plane formed by a surface of the ferromagnetic material; and providing an exciter radiofrequency resonator, converting an exciter radiofrequency signal having a frequency equal to the resonant frequency of the exciter radiofrequency resonator into a pulsed oscillating magnetic field. The pulsed oscillating magnetic field is defined by a vector orthogonal to a vector defined by the bias magnetic field, and excites magnetostatic spin waves in the ferromagnetic material.

According to a further aspect of the invention, methods for detecting magnetostatic spin waves propagating through a ferromagnetic material are provided. The methods include providing a solenoid generating a bias magnetic field at a detection surface of the ferromagnetic material, where the bias magnetic field is parallel to a plane formed by a surface of the ferromagnetic material; providing an detector radiofrequency resonator that resonates at frequencies corresponding to the FMR frequencies of the ferromagnetic material; detecting a pulsed oscillating magnetic field coupled to the magnetostatic spin waves at the detection surface of the ferromagnetic material; and converting the pulsed oscillating magnetic field into a detector radiofrequency signal.

Other features and advantages of the present invention will become apparent to those skilled in the art upon examination of the following or upon learning by practice of the invention.

BRIEF DESCRIPTION OF THE DRAWINGS

The present invention will now be described, by way of example, with reference to the accompanying drawings, wherein like numbers indicate same or similar parts or components, and wherein.

DETAILED DESCRIPTION OF THE INVENTION

The invention described herein, including the various aspects and/or embodiments thereof, meets the unmet needs of the art, as well as others, by providing magnon excitation and detection systems, apparatus, and methods. The systems and apparatus may include magnon exciters and magnon detectors. The systems and apparatus are used in accordance with methods for exciting and detecting magnons.

In some aspects of the invention, the magnon excitation and detection systems, apparatus, and methods are used in conjunction with a magnon propagation media. These may be used in sensing and information carrying applications. Electrons are typically as information carriers in electronic elements and components, but electrons suffer from numerous effects such as noise interference and power consumption due to movement of electron charge. Hence, the development of an alternative to or replacement for electrons in sensors and as information carriers would be beneficial. Magnons are electrically neutral and, therefore, interact weakly with the surroundings.

Magnon-based communication apparatus, systems, methods, and networks are therefore also envisioned in accordance with the invention. The magnon-based communications of the invention provide an improvement over the current electron-based methods for data communication, which include: (i) inductive coupling; (ii) capacitive coupling; (iii) magnetic resonance coupling; (iv) piezoelectric-based transducer ultrasonic sensing; and (v) electromagnetic acoustic transducer (EMAT) based ultrasonic sensing.

Figure 1:
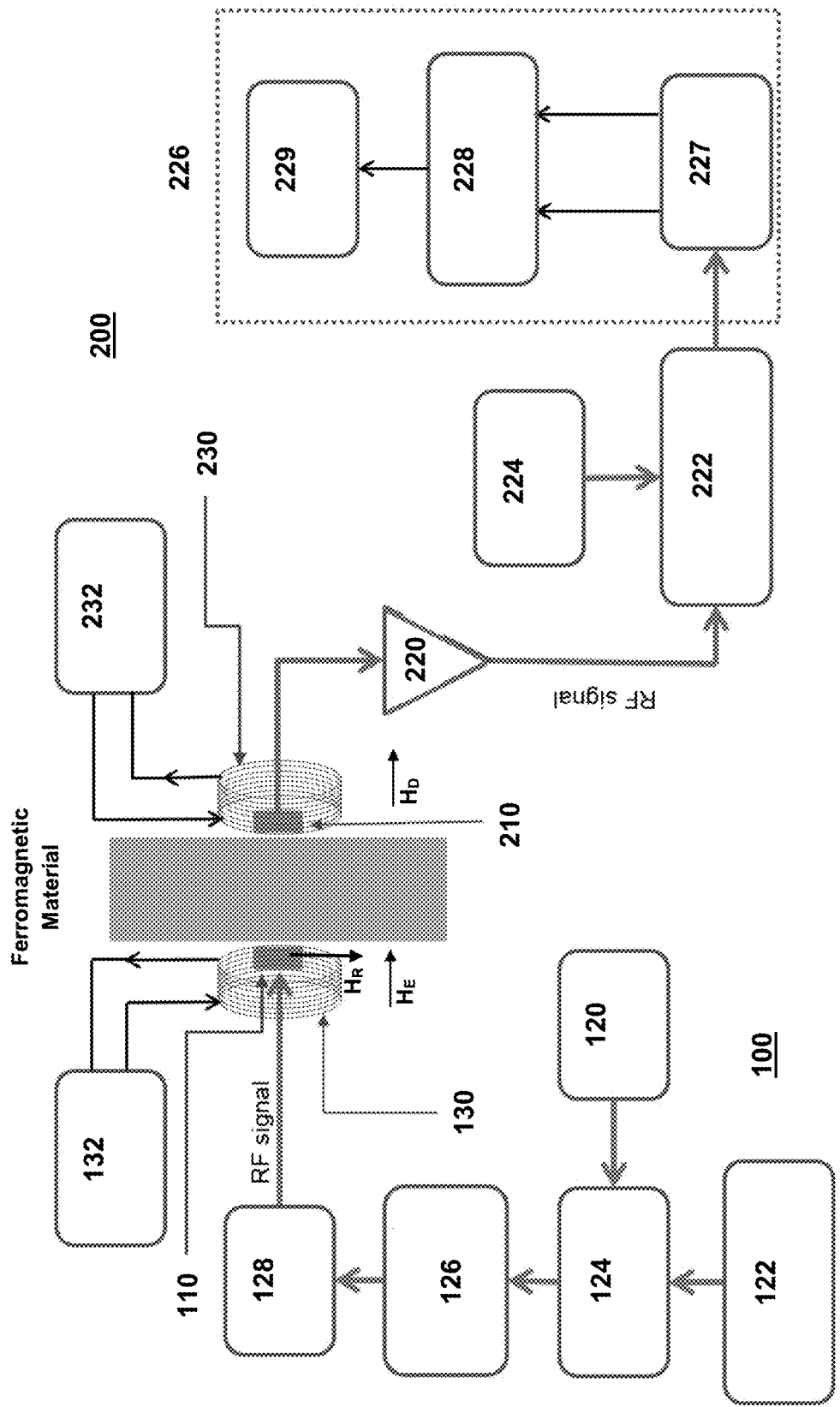
FIG. 1. Diagram of magnon excitation and detection system comprising of a magnon exciter and a magnon detector, used in conjunction with a ferromagnetic magnon propagation medium.

Exemplary apparatus of the invention are depicted in FIG. 1. In some aspects of the invention, the apparatus incorporates magnon excitation and magnon detection components. When magnon excitation and magnon detection capabilities are provided, the apparatus may be referred to as a magnon interconnect apparatus, where "interconnect" refers to a connector, such as a transmission line or cable.

The magnon exciter apparatus 100 may include: an RF resonator 110; a local oscillator 120 and RF signal waveform generator 122 in communication with an RF mixer 124; a bandpass filter 126; an RF signal amplifier 128; an exciter solenoid 130; and an exciter power supply 132.

The exciter power supply 132 energizes the exciter solenoid 130, generating an exciter bias direct current (DC) magnetic field HE vector oriented parallel to the axis of the exciter solenoid 130, which may be directed into a ferromagnetic material. The excited DC magnetic field should be oriented perpendicular to the surface of the ferromagnetic material in order to align the magnetic moments in the material to the orientation of the DC magnetic field. The direction of the alignment of the magnetic moments is proportional to the direction of travel of the magnons.

In operation, the oscillator 120, RF signal waveform generator 122, RF mixer 124, bandpass filter 126, and RF signal amplifier 128 may be provided in a single RF signal module, or as separate RF signal components. The RF signal generated by the RF signal module or RF signal components is directed through exciter solenoid 130 and into an exciter RF resonator 110, which converts the input RF signal into an oscillating magnetic field HR vector with an orientation parallel to the plane of the surface of the ferromagnetic material. The orthogonal orientation between the vector fields HE and HR is a condition required for ferromagnetic resonance in a ferromagnetic material. See C. Kittel, Ferromagnetic resonance. J. Phys. Et radium, 12, 332 (1951).

The magnon detector apparatus 200 may include: a detector RF resonator 210; a low-noise amplifier (LNA) 220; a downconverter 222 in communication with a local oscillator 224; and a module for receiving a signal from downconverter 222. In some aspects of the invention, an optional Software-Defined Radio (SDR) module 226 receives the signal from downconverter 222. When provided, SDR module 226 includes an ND converter 227, a demodulator 228, and a display 229. The magnon detector apparatus also includes a detector solenoid 230, and a detector power supply 232.

In operation, the detector power supply 232 energizes the detector solenoid 230, generating a detector bias DC magnetic field HD vector oriented parallel to the axis of the detector solenoid 230. When used in combination with the magnon exciter apparatus 100, the exciter magnetic field HE vector should be oriented in the same direction as the detector magnetic field HD vector, and have approximately the same intensity (which may be achieved, for example, by configuring power supplies 132 and 232 to generate approximately the same current). The intensity of the bias DC magnetic field must be equal to or greater than the saturation magnetic field of the ferromagnetic material used.

The LNA 220 and downconverter 222 in communication with the local oscillator 224 may be provided in a single RF downconversion module, or as separate RF downconversion components. The RF downconversion module may communicate RF signals from the ferromagnetic material to the optional SDR module 226 to be displayed to a user. Those skilled in the art will appreciate that other receiving modules (e.g., a spectrum analyzer instrument) may be provided instead of, or in addition to, the SDR module 226 to provide additional capabilities to the apparatus and systems of the invention.

The various components of the magnon exciter apparatus 100 and magnon detector apparatus 200 are discussed in further detail below. The apparatus as described herein may include some or all of these components, as well as additional components.

The RF signal amplifier module 128 is preferably a two-port device designed to increase the amplitude an input radio frequency (RF) signal and shall have gain of 20 dB. The RF signal frequency range shall be 4 GHz to 18 GHz.

The intermediate frequency bandpass filter module 126 is preferably a two-port device designed to allow the transmission or passage of RF signals within the frequency band and reject or significantly attenuate out-of-band RF signals.

The RF mixer module 124 is preferably a three-port device designed to multiply the RF signal from the RF signal waveform generator with the RF signal from the local oscillator. The output of the device comprises of RF signals with frequencies at the sum and difference of the two input RF signals together with many harmonic signals from the local oscillator signal.

The RF signal waveform generator module 122 is preferably a one-port device designed to generate a RF signal having an arbitrary waveform.

The local oscillator modules 120, 224 are preferably one-port devices designed to generate a RF signal.

The RF resonator modules 110, 210 are preferably one-port devices that convert an input RF signal into an oscillating magnetic field. The amplitude and frequency of the oscillating magnetic field are preferably greater than or equal to 100 Oe, and between 4 GHz to 18 GHz, respectively. When magnon exciter apparatus 100 and magnon detector apparatus 200 are used together, RF resonators 110, 210 may be provided as a single RF resonator module.

The LNA module is preferably a two-port device designed to increase the amplitude of an input RF signal 220 and reject interfering noise signals.

The downconverter module 222 is preferably a three-port device that multiplies the RF signal from the LNA with the RF signal from the local oscillator. The output of the device comprises of RF signals with frequencies at the sum and difference of the two input RF signals together with many harmonic signals from the local oscillator signal. The device consists of a built-in intermediate bandpass filter designed to select only the RF signals with frequency equal to the difference of the two input RF signals.

SDR module 226 includes an Analog/Digital (A/D) converter module 227, which is a multi-port device that converts an RF signal into a digital signal for processing. The sampling rate and resolution shall be greater or equal to 20 million samples per second and lesser or equal to 13 millivolts respectively. A demodulator 228 and display 229 may also be provided in some aspects of the invention.

The Solenoids are devices that generate static magnetic fields with the input of a direct electric current signal. The devices are formed from insulated solid wire coil with 'N' number of turns wound around a radial direction with a finite length l'.

The exciter and detector power supplies 132, 232 provide direct current (DC) to the solenoid coils 130, 230 using electricity from an outlet source. In some aspects of the invention, the input preferably has an electrical rating with voltage of 110-240 V, a current of about 1 A, and a frequency of about 50/60 Hz. The output preferably supplies an electrical direct current of about 10 A.

As depicted in FIG. 1, the magnon exciter apparatus 100 and magnon detector apparatus 200 of the invention are used in conjunction with a ferromagnetic material 300. In some aspects of the invention, the apparatus and ferromagnetic material may be combined to provide an integrated magnon exciter, ferromagnetic alloy medium, and magnon detector in a single device.

In other aspects of the invention, the magnon exciter 100 and magnon detector 200 may be provided without a ferromagnetic alloy medium, with instructions for a user to select a suitable ferromagnetic material for use as the magnon propagation medium. Those skilled in the art will appreciate that the systems of the invention are not limited to use with any particular ferromagnetic alloy. Ferromagnetic materials that exhibit saturation magnetic fields lower than 1 kOe (0.1 mT) may require solenoid coils with compact dimensional profile, as compared to ferromagnetic materials that have higher saturation fields. Additionally, ferromagnetic materials that exhibit a very low damping parameter value a and a high saturation magnetization Ms (see Equation 1) may contain magnons with high amplitudes and low attenuation during propagation.

Figure 2:
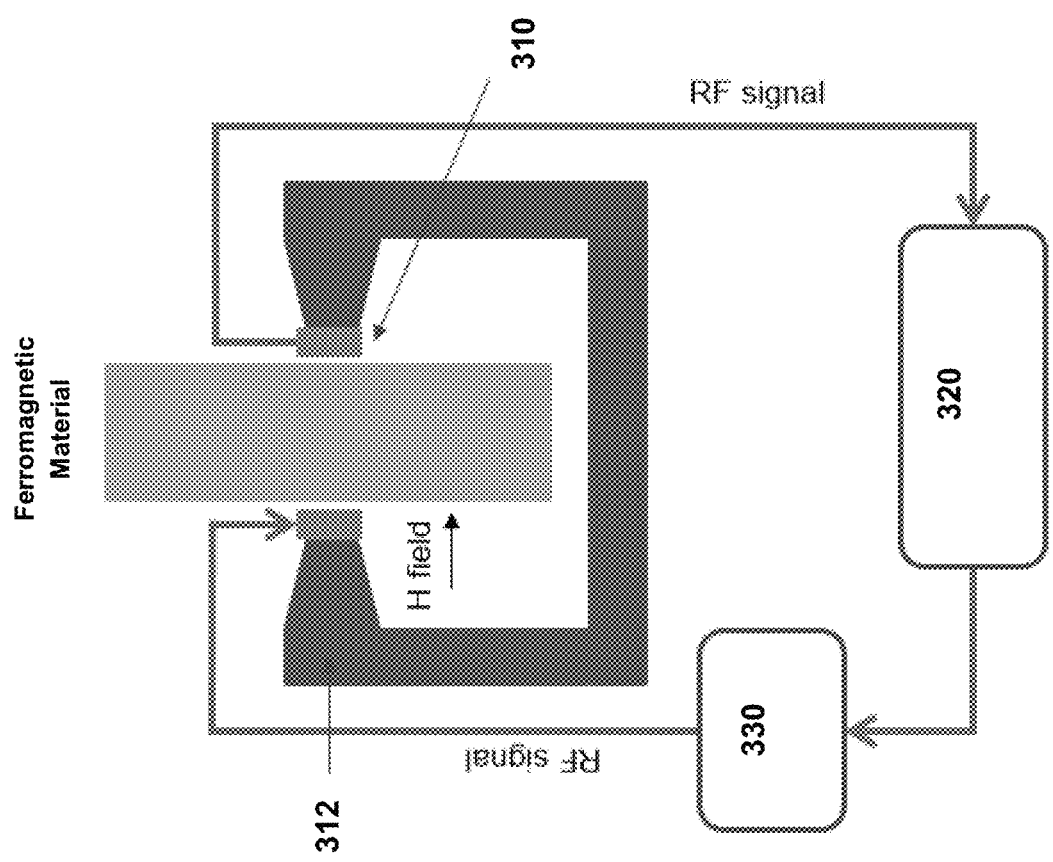
FIG. 2. Diagram of apparatus used to measure the propagation depth of magnons in a sample.

The associated dispersion characteristics of spin waves in ferromagnetic materials (i.e., magnons) may also be analyzed using measurement apparatus 300, as shown in FIG. 2. FIG. 2 depicts an apparatus for measuring the propagation depth of magnons in a ferromagnetic sample material. The apparatus may also be used to determine how thick a given ferromagnetic material can be for use in magnon interconnect apparatus and systems. It incorporates an electromagnet or permanent magnet 312 that is configured to direct a magnetic field H through the ferromagnetic material. An RF resonator 310 is placed between the electromagnet 312 and the ferromagnetic material, with a total separation gap (on both sides) that is lesser than or equal to 1 mm.

The RF resonator 310 is provided in a circuit that converts an RF signal received from Vector Network Analyzer (VNA) 320 (which incorporates both a source of RF signal and one or more receivers for RF signals) into an oscillating magnetic field vector with orientation parallel to the surface of the ferromagnetic material. The orthogonal relationship between the oscillating magnetic field and the bias DC magnetic field provides the condition necessary for the occurrence of FMR. This condition will be present at both sides of the ferromagnetic material. At the occurrence of FMR, the frequency of the oscillating magnetic field equals the frequency of the magnons, thus enabling the coupling of energy from the oscillating magnetic field to the magnons. The excited magnons then propagate through the ferromagnetic material with a finite depth. If the propagation depth is larger than the depth of the material, the RF resonator on the detection side will be able to detect the magnons. The RF signal may optionally be amplified using RF signal amplifier 330. The VNA analyzes changes in the RF signals to determine if the signal was sufficient to propagate through the ferromagnetic material.

Figure 3:
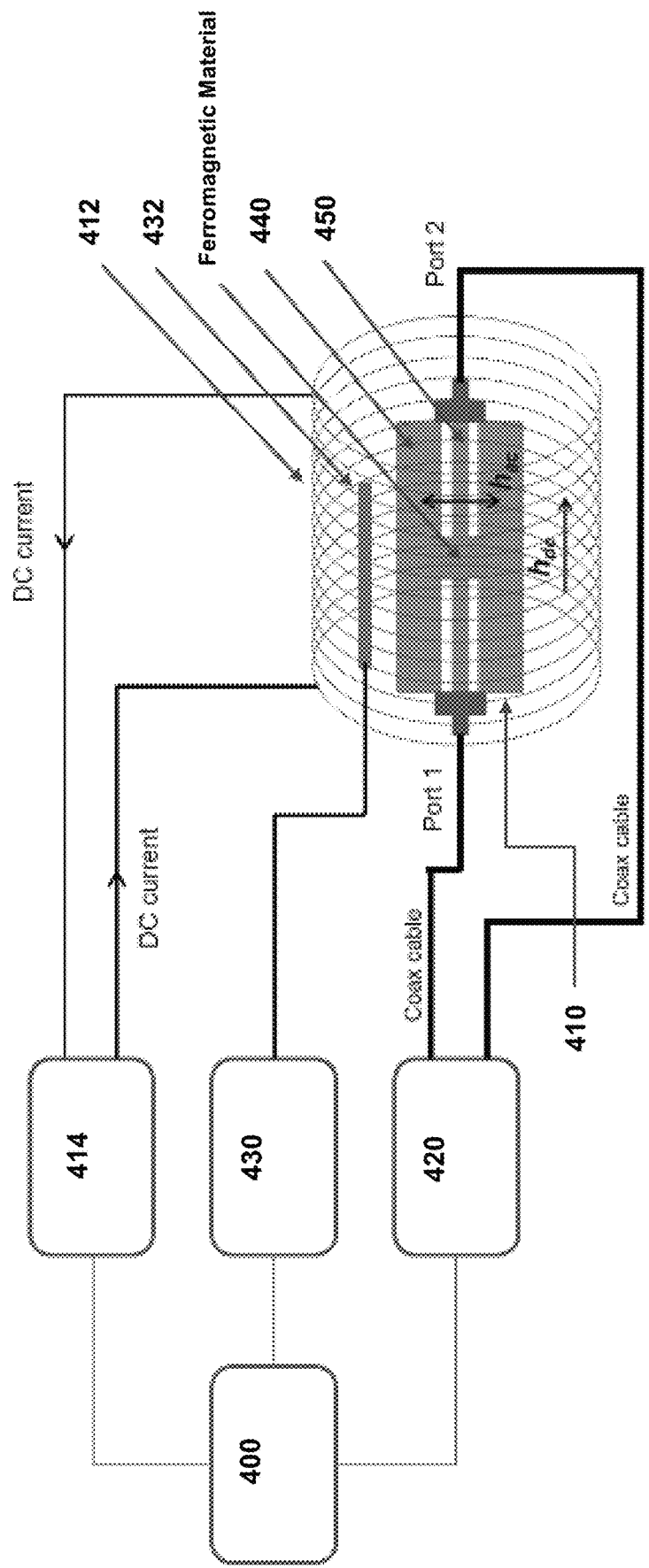
FIG. 3. Diagram of VNA-FMR spectrometer.

FIG. 3 depicts a VNA Ferro-Magnetic Resonance (VNA-FMR) spectrometer that operates using the principles of the measurement apparatus described above with reference to FIG. 2. Computer 400 is provided for analyzing signals from VNA 420 and optional gauss meter 430 (with associated gauss probe 432), and may optionally include processors programmed to analyze the signals and visually display or otherwise convey them to a user (for example, audibly). A power supply 414 is provided to supply direct current to a solenoid coil 412, generating a DC bias magnetic field $h_{dc}$. Resonator 410 is configured as a coplanar waveguide (CPW) transmission line sample holder, and holds the sample of ferromagnetic material. The sample holder includes CPW ground 440 and signal 450 lines, and translates RF signal from the VNA into a uniform microwave magnetic field ($h_{ac}$), transmitting it along the length of the CPW signal line 450. Those skilled in the art will appreciate that although a CPW line was selected, use of microstrip and slot lines are within the scope of the invention. In some aspects of the invention, a rectangular waveguide can be used as the RF resonator. The VNA-FMR may be used to excite backward-volume magnetostatic spin waves (BVMSW).

Figure 4:
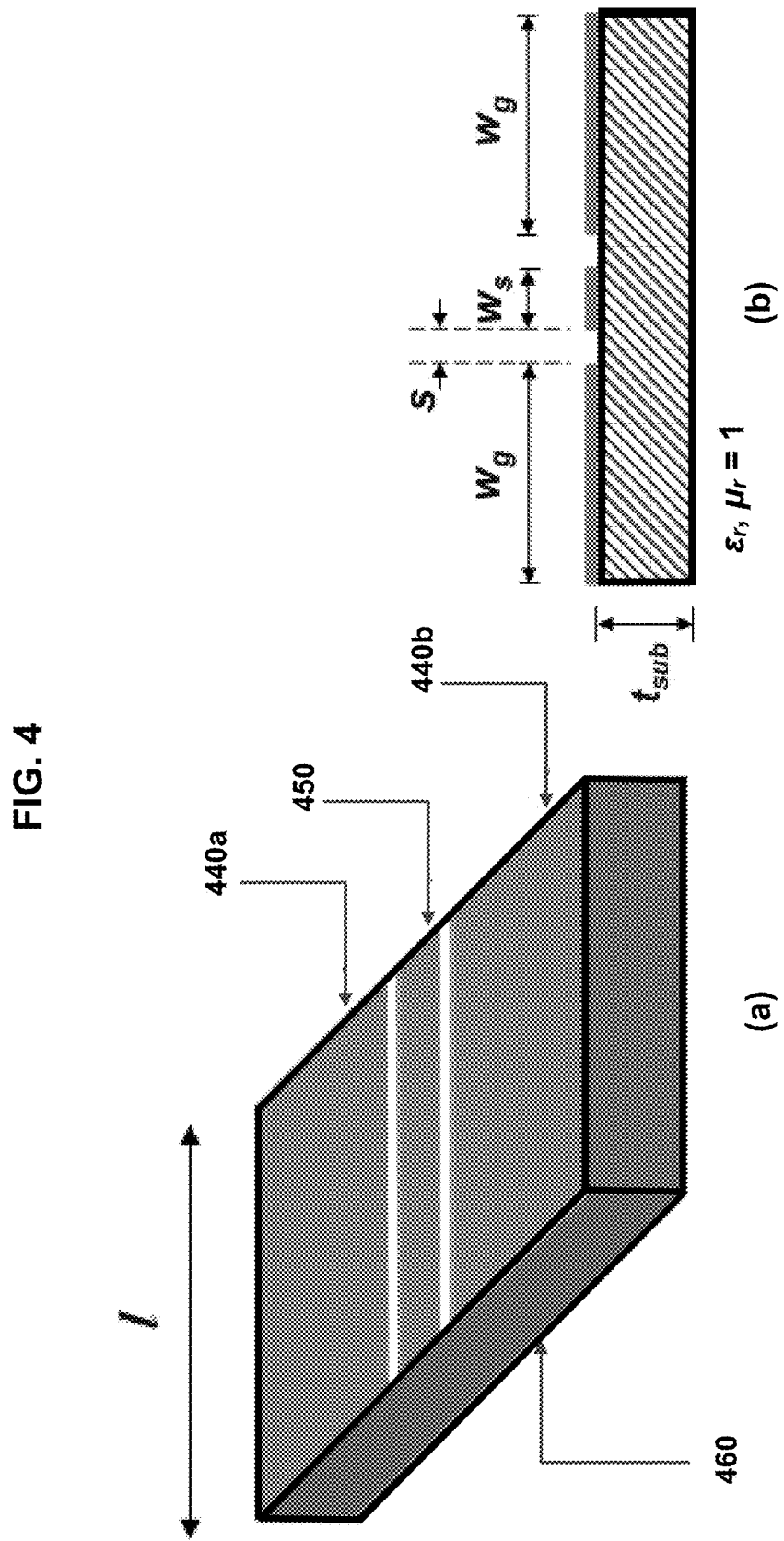
FIGS. 4(a)-(b). RF Resonator CPW line sample holder. (a) Isometric view; (b) cross-sectional view.

FIGS. 4(*a*) and 4(*b*) are plan and cross-sectional views of the RF resonator 410 of FIG. 3. The ground lines 440*a*, 440*b* ($w_g$) and signal line 450 ($w_s$) are shown as printed on a circuit board 460, and are separated by gaps s.

Magnon transmission analysis apparatus are described above, but those skilled in the art will appreciate that additional characterization measurements of the overall system may be performed, including communications tests such as bit-error-rate (BER) measurement using modulation techniques including binary phase shift keying (BPSK), frequency shift keying (FSK), amplitude shift keying (ASK), etc. BER is the ratio of the number of bits received in error over the number of total bits transmitted. The BER measurement quantifies the quality of the transmission of a digital signal by comparing the transmitted sequence of bits to the received bits and recording the number of errors during transmission.

In additional aspects of the invention, the magnon excitation and detection systems and apparatus are incorporated into sensing and communication apparatus.

Methods for exciting magnons in accordance with the invention may be carried out in accordance with the following steps: (1) The solenoid and RF resonator components of the magnon exciter are designed to establish the condition needed for FMR at the surface of the ferromagnetic medium. These conditions include: (i) the oscillating magnetic vector is orthogonal to the bias DC magnetic field vector (ii) the magnitude or intensity of the bias DC magnetic field is greater than or equal to the saturation magnetic field of the ferromagnetic medium. (2) The RF resonator in the magnon exciter is designed to resonate at frequencies equal to the FMR frequencies of the ferromagnetic medium. The FMR frequencies may be determined by performing a FMR measurement of the ferromagnetic medium, using techniques known to those skilled in the art. (3) The RF resonator converts an RF signal with a frequency equal to the resonator's resonant frequency into an oscillating magnetic field vector. (4) The magnons located around the surface of the ferromagnetic medium are exposed to the conditions necessary for FMR (stated above), thus enabling the coupling of energy from the oscillating magnetic field to the localized magnons. The input RF signal fed into the RF resonator is considered a pulsed modulated RF signal. The resulting oscillating magnetic field generated by the RF resonator will be a pulsed modulated oscillating magnetic field. The frequency of the pulsed modulated field must be equal to the FMR frequency of the ferromagnetic medium to enable the magnons on the surface to absorb the energy and propagate through the medium to a finite depth. An RF amplifier may be provided to ensure that the amplitude of the magnons that propagate through the medium is sufficient for detection by the RF resonator of the magnon detector.

Methods for detecting magnons in accordance with the invention may include the following steps: (1) The solenoid and RF resonator components of the magnon detector are designed to establish the condition needed for FMR at the surface of the ferromagnetic medium. (2) The RF resonator is designed to resonate at a frequency equal to the FMR of the medium, and it will therefore detect any resulting pulsed modulated oscillating magnetic fields that are coupled to the pulsed modulated magnons on the surface of the ferromagnetic medium that propagated from the magnon exciter. This RF resonator converts the detected field into a RF signal that is input into the LNA for amplification and noise reduction. The RF signal frequency is reduced to a frequency equal to the frequency of the RF signal generated by the RF signal waveform generator 122 after passing through the down-converter. The RF signal is fed into an A/D converter 227 for conversion into a digital signal for digital signal processing.

The methods of the invention may provide the basis for using magnons as information carriers in communications applications, by combining the magnon excitation methods and magnon detection methods. As noted above, electrons suffer from numerous deleterious effects such as noise interference and power consumption due to movement of electron charge, which can degrade communications transmitted via electrons. Magnons are electrically neutral and interact weakly with their surroundings. Magnon-based communication networks are therefore envisioned in accordance with the apparatus, systems, and methods of the invention, in which magnons replace or augment electrons as information carriers.

EXAMPLES

The invention will now be particularly described by way of example. However, it will be apparent to one skilled in the art that the specific details are not required in order to practice the invention. The following descriptions of specific embodiments of the present invention are presented for purposes of illustration and description. They are not intended to be exhaustive of or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

Example 1. Empirical Prediction and Measurement of the Broadband Ferromagnetic Resonance in HY-80 Steel 1.1. Sample Fabrication The HY-80 sample was fabricated in accordance with Base Materials for Critical Applications: Requirements for Low Alloy Steel Plate, Forgings, Castings, Shapes, Bars, and Heads of HY-80/100/130 and HSLA-80/100. (Technical Report No. T9074-BD-GIB-010/0300) U.S. Navy, Naval Sea Systems Command (2012).

Prior to imaging, the specimen was mechanically polished using standard metallographic methods and underwent a final vibratory polishing procedure using 0.04 µm colloidal silica. The map was collected using a Hitachi SU6600 Field Emission Scanning Electron Microscope (FE-SEM) and an EDAX Hikari Electron Backscatter Diffusion (EBSD) detector with an accelerating voltage of 30 kV and a pixel spacing of 0.5 µm.

1.2. Magnetization

At room temperature, magnetization hysteresis measurement of the test sample was made via a Vibrating Sample Magnetometer (VSM) manufactured by Lake Shore Cryotronics, Inc. The magnetization hysteresis data was recorded for post data-processing to extract the magnetic parameters such as saturation magnetization, coercive field, saturation field, etc.

1.3. Ferromagnetic Resonance

A Vector Network Analyzer Ferro-Magnetic Resonance (VNA-FMR) spectrometer, as shown in the FIG. 3, was designed and built. The spectrometer includes a VNA 420, solenoid coil 412 (radius of 1.98 in, length of 5.6 in, 900 turns and AWG 8 solid core insulated copper wire), axial gauss probe 432 (Lake Shore, Model 455), gauss meter 430 (Lake Shore, Model 475), DC power supply 414, coplanar waveguide (CPW) transmission line sample holder 410, and computer 400. The VNA-FMR setup shown in FIG. 3 may be used to determine the magnon propagation constant in the HY-80 sample and determine the RF signal power levels needed to excite magnons that can propagate therethrough.

The sample under test (SUT) was placed on the top surface (without making electrical contact) of an RF Resonator sample holder 410, which is also shown in greater detail in FIGS. 4(a) and 4(b), which depicts a sample holder in which $W_g$=20 mm, $W_s$=6.5 mm, 1=62.5 mm, s=1 mm, $\varepsilon_r$=8.0, and $t_{sub}$=1.5 mm. The RF Resonator includes an open-circuit CPW transmission line with a one-sided copper-clad printed circuit board on an FR1 substrate 460. The resonator has a 6.5 mm wide center conductor 450, 1 mm spacing between center conductor and ground 440a, 440b, a length of 62.5 mm and a characteristic impedance of 50 Ω. The CPW line was chosen instead of microstrip or slot lines due to its low dispersion, broadband bandwidth performance and simple one-side-only fabrication. The resonator is designed to have a broadband resonance that covers the FMR frequencies of the ferromagnetic sample material (i.e., 15 GHz to 18 GHz for HY-80 steel). The CPW sample holder, together with a gauss Hall probe, are placed horizontally inside the solenoid coil along the axis and at the mid-point, as shown in FIG. 3. The measured reflection coefficient and impedance spectrum indicates that the resonator meets the FMR frequency requirement for the magnon exciter and detector designs.

The gauss hall probe was connected to a gauss meter for reading the magnetic field within the vicinity of the sample, while the CPW line terminals were connected to ports 1 and 2 of the VNA via a low-loss coax cable for the measurement of the complex transmission coefficient Sit. The CPW line translates microwave signal from the VNA ports into a uniform microwave magnetic field ($h_{ac}$) along the length of the CPW line. The VNA module was first calibrated before use with the SLOT technique (H. J. Eul & B. Schiek, "A generalized theory and new calibration procedures for network analyzer self-calibration." IEEE Transactions on Microwave Theory and Techniques, 39(4), 724-731 (1991)) within the radio-frequency signal range of 10 MHz to 26 GHz to subtract the contribution of the coax cables between the VNA and the CPW sample holder. A DC power supply, including a signal function generator (HP 3325B) and a high power amplifier (Tectron Model 7782), was connected to the solenoid coil and supplied DC current needed by the coil to generate a DC bias magnetic field ($\vec{h}_{dc}$) within the range of 0 Oe to 2800 Oe along axis of the coil. Hence, the total applied field on the sample is $\vec{H}_{app}=\vec{h}_{dc}+\vec{h}_{ac}$.

For each DC bias magnetic field value, the transmission coefficient Sit was measured and recorded. In order to subtract the non-magnetic background (i.e., contributions from the CPW line) the algorithm in Equation (9) was used to obtain the normalized transmission coefficient $$S_{12}^{FMR} = \frac{s_{12} - s_{12}^{CPW}}{s_{12}}, \tag{9}$$

where $S_{12}^{CPW}$ the transmission coefficient for only the CPW line and S12 is the transmission coefficient measured when the sample is on the surface (without making electrical contact) of the CPW. The results are displayed in FIG. 5, where the solid line indicates the BVMSW empirical modeling prediction.

1.4. Results and discussions

Figure 6:
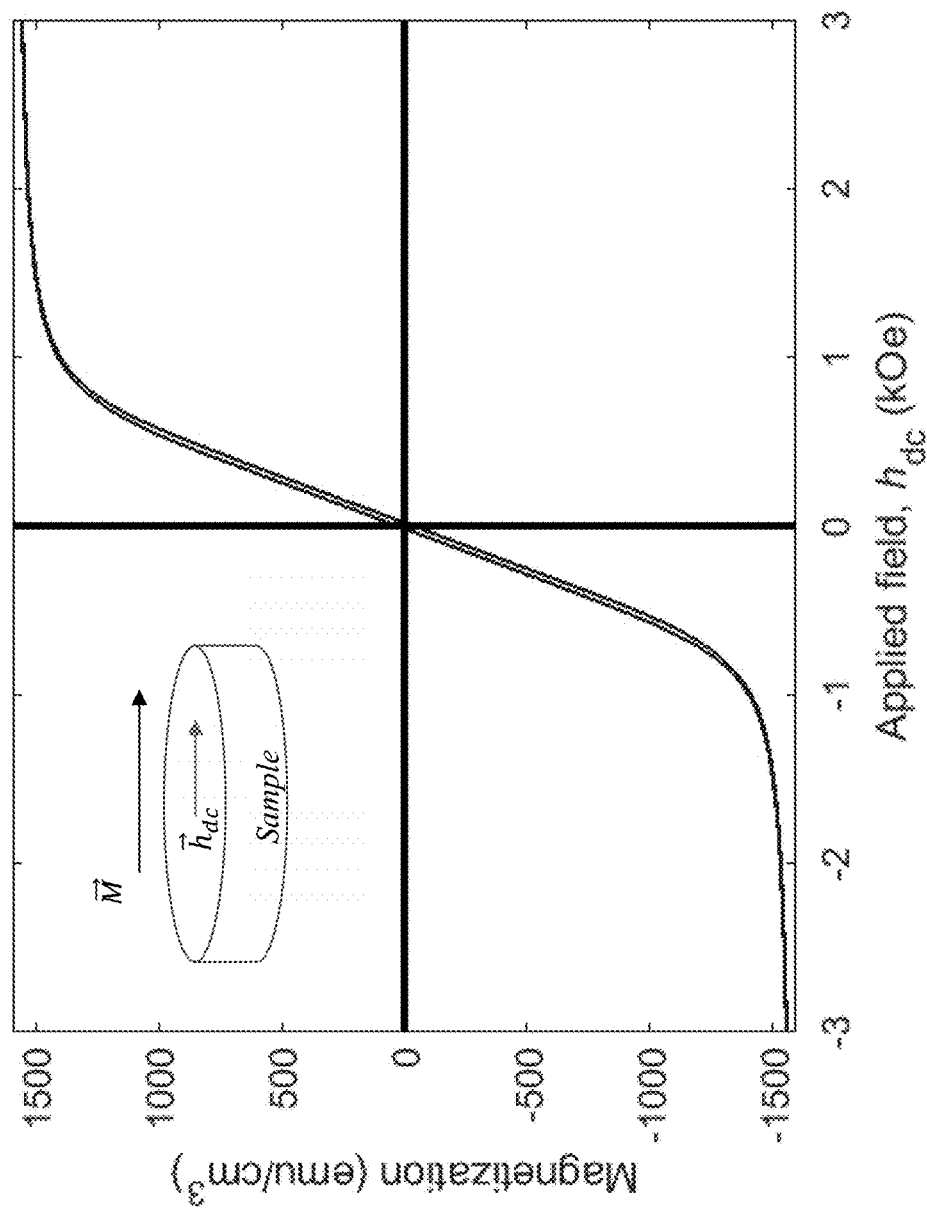
FIG. 6. Measured magnetic hysteresis major loops for HY-80 samples.

The results of the magnetization experiment are depicted in FIG. 6. Each sample was a disk with 0.7 cm in diameter and 0.1 cm thick, and the applied field was oriented in-plane to the surface of the disk. The plot shows the magnetic hysteresis major loop measurements on the HY-80 steel sample via the VSM. The hysteresis loop is comparable to the hysteresis loop of a ferromagnet and the sample saturates with a magnetization $M_s$ of approximately 1550 emu/cm$^3$ at a magnetic field strength $h_{dc}$ greater or equal to 1500 Oe. Additionally, the small area within the hysteresis loop indicates a weak ferromagnetic ordering of the magnetic moments in the sample.

Figure 7:
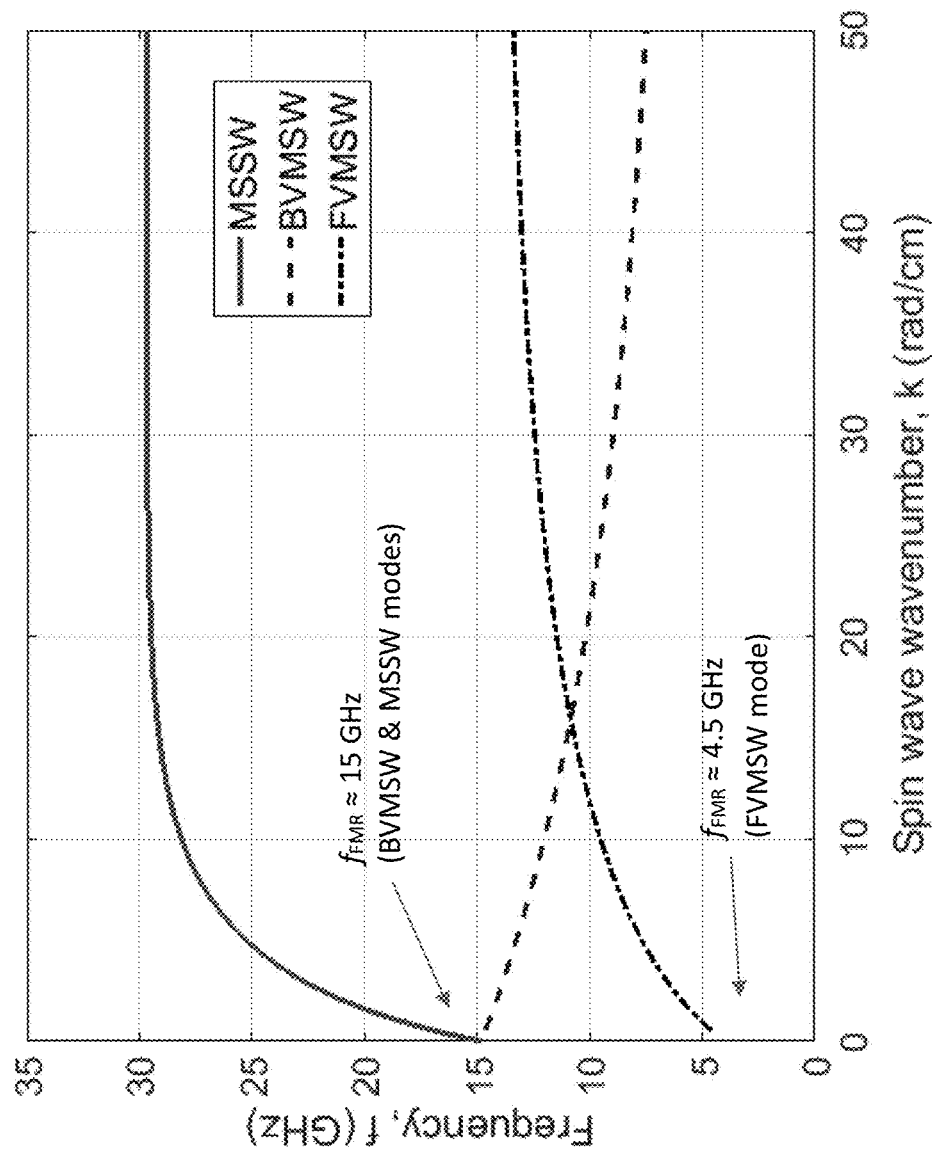
FIG. 7. Dispersion relationship obtained for the samples of FIG. 6 at H=1500 Oe.
Figure 8:
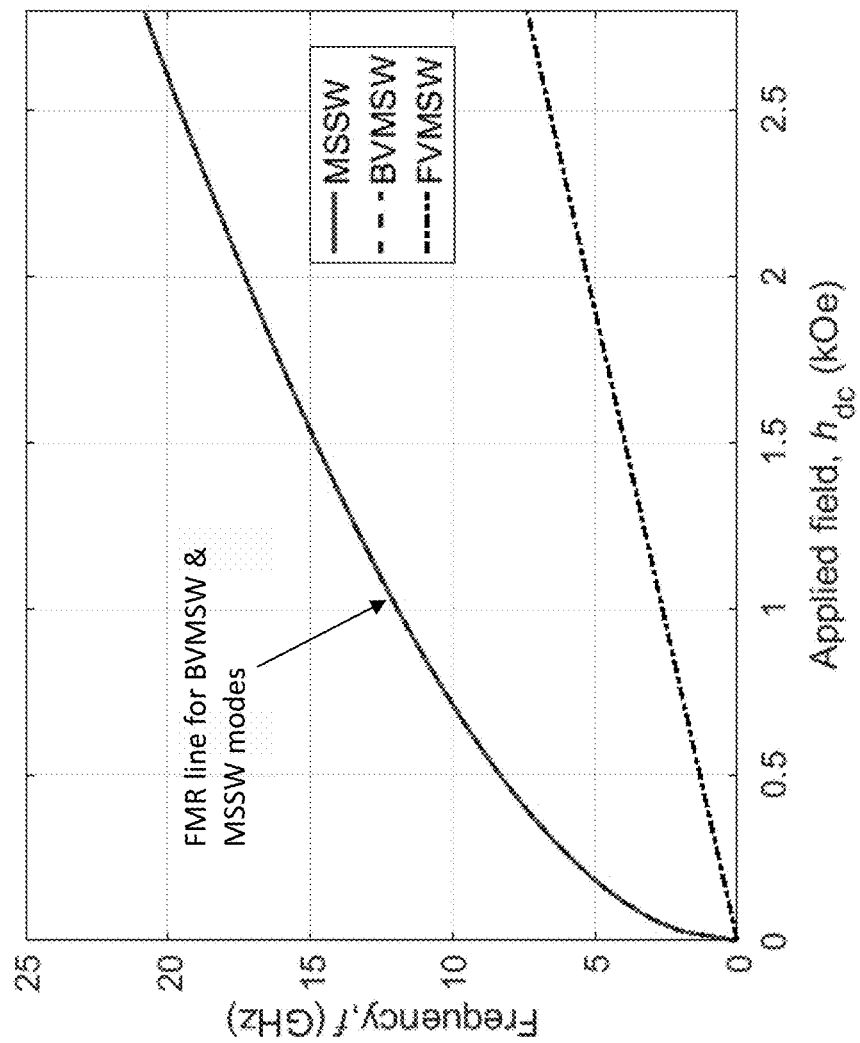
FIG. 8. FMR spectrum from empirical model for HY-80 steel sample.

The measured magnetic properties of HY-80 were used to empirically predict the dispersion relationship of the modes of the magnons in the sample as described in Equations (6)-(8). Assuming the gyromagnetic ratio of the sample of FIG. 6 is 2.64×106 (W. Mingzhoung, "Nonlinear Spin Waves in Magnetic Film Feedback Rings." Solid State Physics, 62, 163-224 (2011)), FIG. 7 shows the results of the prediction indicating that the samples undergo ferromagnetic resonance (FMR) under a DC bias field of 1500 Oe at approximately 15 GHz for both BVMSW and MSSW modes and at 4.5 GHz for FVMSW mode. Observably, both FVMSW and MSSW modes have positive group velocities $v_g = d\omega/dk$ while the BVMSW mode has a negative group velocity. FIG. 8 shows FMR spectrum predictions for the samples as the magnetic field ranges from 0 Oe to 2800 Oe.

Figure 5:
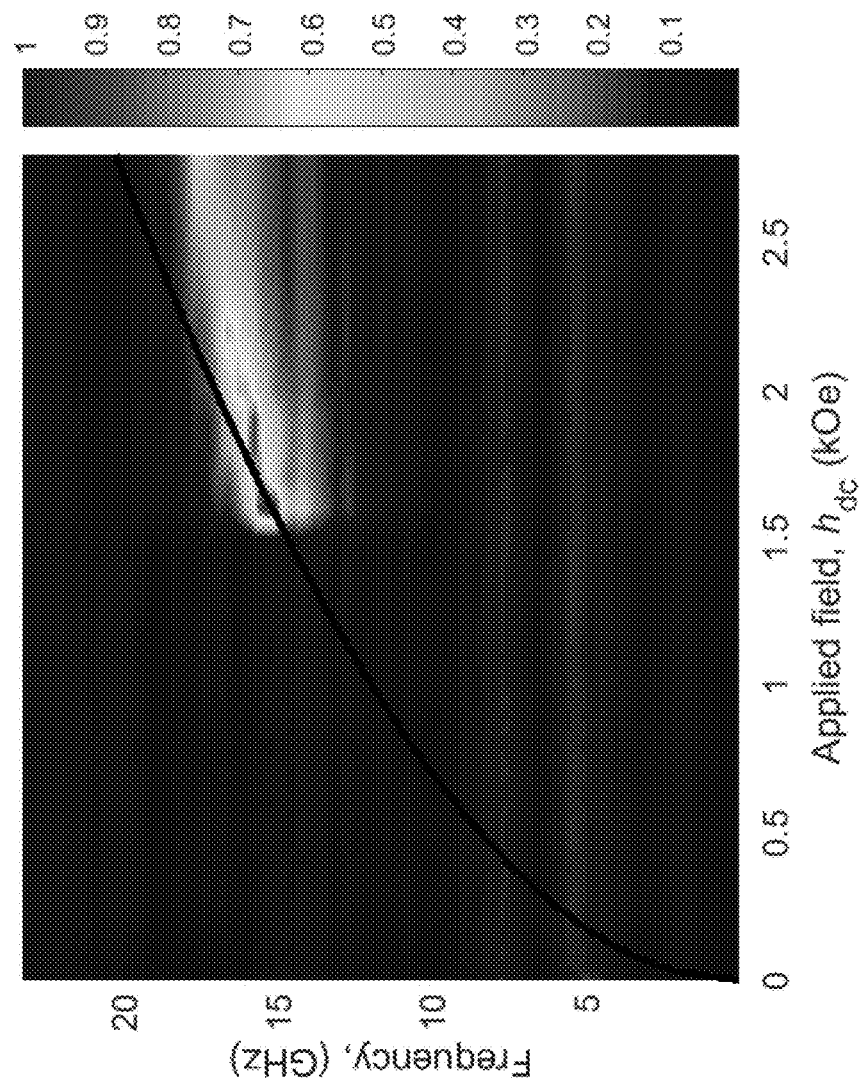
FIG. 5. 2D mapped amplitude of the FMR spectrum obtained from the VNA-FMR spectrometer.
Figure 9:
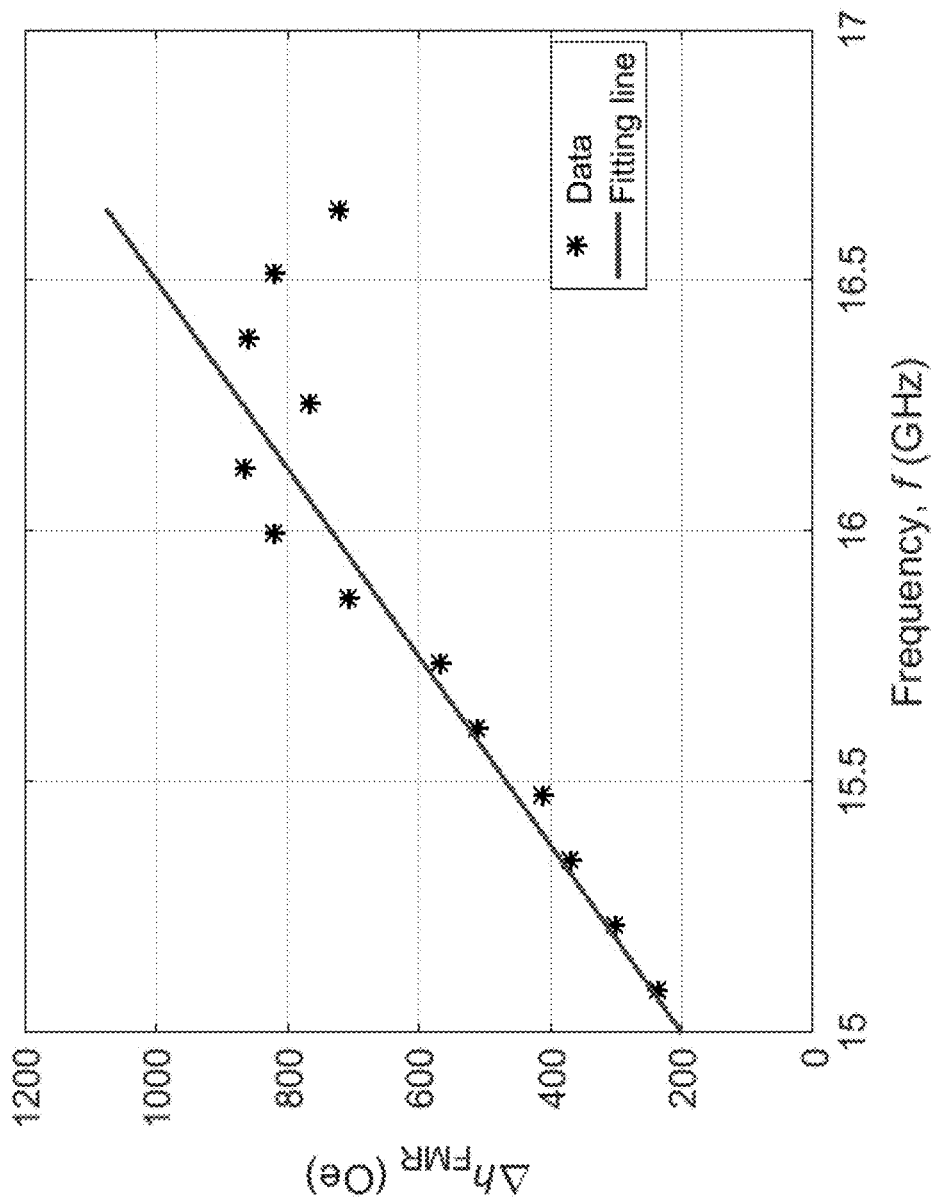
FIG. 9. FMR magnetic field linewidth $\Delta h_{FMR}$ versus resonance frequency f and fit of data points.

The measured two-dimensional (2D) mapped amplitude of the FMR spectrum of the HY-80 sample is shown in FIG. 5 (applying Equation (9)). At the FMR frequency, the frequency of the microwave magnetic field equals the frequency at which the electron spin precedes around the DC bias magnetic field, enabling coupling between the spin waves (magnons) and the microwave magnetic field. A. V. Chumak, et al., "Magnon transistor for all-magnon data processing." Nature Commun. 5, 4700 (2014); C. Kittel, "Ferromagnetic resonance." J. Phys. Et radium, 12, 332 (1951); C. S. Davis, et al., "Mapping the magnonic landscape in patterned magnetic structures." arXiv 1706.03212 (2009). The result shown in FIG. 5 indicates that the FMR frequency (proportional to the magnon frequency) of the HY-80 sample ranges from approximately 15 GHz to 18 GHz when the DC bias magnetic field ranges from 1500 Oe to 2800 Oe. This finding concurs with the predicted FMR spectrum (FIG. 9) from the empirical modeling.

Additionally, a vital dimensionless magnetic parameter known as the Gilbert damping constant $\alpha$ in Equation (1), describes the amount of damping on the spin precession. In order to extract the amount of damping of the spins in the HY-80 sample, a technique based on the LLG model for estimating the damping parameter was employed. S. Vonsovskii, Ferromagnetic Resonance. Oxford: Pergamon (1960); J. Pelzl, et al., "Spinorbit-coupling effects on g-value and damping factor of the ferromagnetic resonance in Co and Fe films." Journal of Physics: Condensed Matter, 15, S451-S463 (2003).

The resonance magnetic field linewidth in terms of resonance frequency is derived as:

$$\Delta h_{FMR} = \Delta h_0 + 4\pi\alpha\frac{f}{\gamma} \quad (10)$$

where f is the resonance frequency and $\Delta h_0$ contains all extrinsic contributions including inhomogeneities. The damping constant can be extracted from the slope of Equation (10). In applying this technique, the measured FMR spectrum in FIG. 5 was utilized by fitting the resonance peaks with a Lorentzian function and find the Full Width at Half Maximum (FWHM), which corresponds to the FMR magnetic field linewidth $\Delta h_{FMR}$. Afterwards, plotting $\Delta h_{FMR}$ versus f, the damping parameter $\alpha$ is extracted from the computed slope of the data points and shown in FIG. 9. The value found was $\alpha \cong 0.112$ within the frequency range of 15 GHz-16.5 GHz.

1.5. Conclusion

Results obtained from magnetization measurement, VNA-FMR measurement and FMR empirical predication on a HY-80 sample are presented in these Examples. The HY-80 sample was found to have a saturation magnetization of 1550 emu/cm$^3$ for $h_{dc}$ >1500 Oe. The measured 2D FMR map showed strong FMR peaks between ~15 GHz-17 GHz when the DC bias magnetic field ranged from 1500 Oe to 2800 Oe. The damping parameter, after applying the methods described by Davis et al. and Vonsovskii, was found to be $\alpha \cong 0.112$ within the frequency range of 15 GHz-16.5 GHz.

It will, of course, be appreciated that the above description has been given by way of example only and that modifications in detail may be made within the scope of the present invention.

Throughout this application, various patents and publications have been cited. The disclosures of these patents and publications in their entireties are hereby incorporated by reference into this application, in order to more fully describe the state of the art to which this invention pertains.

The invention is capable of modification, alteration, and equivalents in form and function, as will occur to those ordinarily skilled in the pertinent arts having the benefit of this disclosure. While the present invention has been described with respect to what are presently considered the preferred embodiments, the invention is not so limited. To the contrary, the invention is intended to cover various modifications and equivalent arrangements included within the spirit and scope of the description provided above.

What is claimed:

1. A method for exciting magnetostatic spin waves in a ferromagnetic material having ferromagnetic resonance (FMR) frequencies, comprising:
   providing a solenoid generating a bias magnetic field at an excitation surface of the ferromagnetic material, where the bias magnetic field is parallel to a plane formed by a surface of the ferromagnetic material; and
   providing an exciter radiofrequency resonator, converting an exciter radiofrequency signal having a frequency equal to the resonant frequency of the exciter radiofrequency resonator into a pulsed oscillating magnetic field,
   wherein the pulsed oscillating magnetic field is defined by a vector orthogonal to a vector defined by the bias magnetic field, and
   wherein the pulsed oscillating magnetic field excites magnetostatic spin waves in the ferromagnetic material.

2. The method of claim 1, where the bias magnetic field has an intensity that is greater than or equal to a saturation magnetic field of the ferromagnetic material.

3. The method of claim 1, where the exciter radiofrequency resonator resonates at frequencies corresponding to the FMR frequencies of the ferromagnetic material.

4. The method of claim 1, where the pulsed oscillating magnetic field is propagated through the ferromagnetic material.

5. The method of claim 4, further comprising detecting the magnetostatic spin waves propagating through the ferromagnetic material, comprising:
- providing a solenoid generating a bias magnetic field at a detection surface of the ferromagnetic material, where the bias magnetic field is parallel to a plane formed by a surface of the ferromagnetic material;
- providing an detector radiofrequency resonator that resonates at frequencies corresponding to the FMR frequencies of the ferromagnetic material;
- detecting a pulsed oscillating magnetic field coupled to the magnetostatic spin waves at the detection surface of the ferromagnetic material; and
- converting the pulsed oscillating magnetic field into a detector radiofrequency signal.

6. The method of claim 5, further comprising amplifying and reducing noise in the detector radiofrequency signal.

7. The method of claim 5, further comprising downconverting the detector radiofrequency signal, reducing it to a frequency equal to the exciter radiofrequency signal.

8. The method of claim 5, further comprising converting the detector radiofrequency signal into a digital signal.

* * * * *